(12) United States Patent
Na et al.

(10) Patent No.: US 10,648,880 B2
(45) Date of Patent: May 12, 2020

(54) PRESSURE SENSOR DEVICE AND MANUFACTURING METHOD THEREOF

(71) Applicant: ITM SEMICONDUCTOR CO., LTD., Chungcheongbuk-do (KR)

(72) Inventors: Hyuk Hwi Na, Chungcheongbuk-do (KR); Ho Seok Hwang, Gyeonggi-do (KR); Ja Guen Gu, Chungcheongbuk-do (KR); Hyang Won Kang, Chungcheongbuk-do (KR)

(73) Assignee: ITM SEMICONDUCTOR CO., LTD., Chungcheongbuk-Do (KR)

( * ) Notice: Subject to any disclaimer, the term of this patent is extended or adjusted under 35 U.S.C. 154(b) by 196 days.

(21) Appl. No.: 15/735,676

(22) PCT Filed: Apr. 11, 2016

(86) PCT No.: PCT/KR2016/003773
§ 371 (c)(1),
(2) Date: Dec. 12, 2017

(87) PCT Pub. No.: WO2016/204389
PCT Pub. Date: Dec. 22, 2016

(65) Prior Publication Data
US 2018/0364126 A1   Dec. 20, 2018

(30) Foreign Application Priority Data
Jun. 15, 2015 (KR) .......................... 10-2015-0084321

(51) Int. Cl.
*G01L 19/14* (2006.01)
*G01L 19/06* (2006.01)
(Continued)

(52) U.S. Cl.
CPC .......... *G01L 19/0654* (2013.01); *G01L 13/02* (2013.01); *G01L 13/06* (2013.01);
(Continued)

(58) Field of Classification Search
CPC ... G01L 19/147; G01L 9/0042; G01L 9/0054; G01L 9/0072; G01L 13/025; G01L 19/04;
(Continued)

(56) References Cited

U.S. PATENT DOCUMENTS

2002/0062698 A1* 5/2002 Baba .................... G01L 19/0084
73/754
2010/0133631 A1* 6/2010 Benzel .................... G01L 15/00
257/417
(Continued)

FOREIGN PATENT DOCUMENTS

CN          201262579 Y      6/2009
CN          101474947 A      7/2009
(Continued)

*Primary Examiner* — Andre J Allen
(74) *Attorney, Agent, or Firm* — Mayer & Williams, PC; Stuart H. Mayer

(57) ABSTRACT

Provided are a pressure sensor device and a method of manufacturing the same. The pressure sensor device includes a housing including an air inlet and a fluid inlet provided in different directions, a substrate provided in an inner space of the housing and including a through-hole through which the air passes, and a pressure sensor chip mounted on the substrate to cover the through-hole in such a manner that a pressure of a fluid flowing in from the fluid inlet is applied to a top surface thereof and a bottom surface thereof is exposed to the air through the through-hole, in order to measure the pressure of the fluid relative to a pressure of the air, wherein the inner space is divided into an upper region and a lower region with respect to the substrate, and wherein the upper region is divided into a first inner region in which the pressure sensor chip is provided and a second inner region through which the air passes.

20 Claims, 13 Drawing Sheets

(51) Int. Cl.
*G01L 13/02* (2006.01)
*G01L 19/00* (2006.01)
*G01L 13/06* (2006.01)

(52) U.S. Cl.
CPC ...... *G01L 19/0038* (2013.01); *G01L 19/0069* (2013.01); *G01L 19/06* (2013.01); *G01L 19/14* (2013.01); *G01L 19/143* (2013.01); *H01L 2224/48091* (2013.01); *H01L 2224/48137* (2013.01)

(58) Field of Classification Search
CPC . G01L 19/0038; G01L 19/0084; G01L 19/14; G01L 9/0075; G01L 19/0069; G01L 19/0618; G01L 9/0055; G01L 9/0073; G01L 19/0092; G01L 19/0645; G01L 19/143; G01L 9/0051; G01L 9/0052; G01L 11/025; G01L 19/0007; G01L 19/0046; G01L 19/06; G01L 19/0627; G01L 19/0681; G01L 27/002; G01L 9/00; G01L 9/0041; G01L 9/0044; G01L 11/04; G01L 19/0023; G01L 19/069; G01L 19/142; G01L 19/16; G01L 7/00; G01L 7/163; G01L 7/166; G01L 9/0047; G01L 9/12; G01L 11/02; G01L 13/00; G01L 15/00; G01L 19/003; G01L 19/0609; G01L 19/0672; G01L 19/083; G01L 19/10; G01L 19/148; G01L 27/005; G01L 7/08; G01L 7/082; G01L 9/0045; G01L 9/0048; G01L 9/006; G01L 9/007; G01L 9/0076; G01L 9/04; G01L 9/045; G01L 9/06; G01L 9/065; G01L 9/125; G01L 11/00; G01L 17/00; G01L 19/00; G01L 19/0015; G01L 19/0076; G01L 19/02; G01L 19/08; G01L 19/141; G01L 19/145; G01L 19/146; G01L 1/142; G01L 1/2262; G01L 1/246; G01L 21/12; G01L 23/16; G01L 27/007; G01L 7/04; G01L 7/063; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/08; G01L 9/085; G01L 9/105; G01L 9/14; G01L 9/16; H01L 2224/48091; H01L 2924/00014; H01L 2224/48145; H01L 2224/73265; H01L 2924/00012; H01L 2224/04105; H01L 2224/24137; H01L 2224/48137; H01L 2224/49175; H01L 24/19; H01L 2924/1461; H01L 2924/1815; H01L 2924/18162; H01L 29/84; H01L 41/047; H01L 41/0475; H01L 41/1132

USPC ...................................... 73/700–756

See application file for complete search history.

(56) References Cited

U.S. PATENT DOCUMENTS

2012/0017689 A1* 1/2012 Giordano ............ A47L 15/4244
73/722
2019/0086282 A1* 3/2019 Na ........................ G01D 11/245

FOREIGN PATENT DOCUMENTS

| CN | 201903425 U | 7/2011 |
|---|---|---|
| CN | 102401715 A | 4/2012 |
| CN | 102809459 A | 12/2012 |
| CN | 104198107 A | 12/2014 |
| EP | 0338728 A2 | 4/1989 |
| JP | 09-178596 | 7/1997 |
| JP | 10-206261 | 8/1998 |
| JP | 2008-241327 | 10/2008 |
| KR | 1020130092464 A | 8/2013 |
| KR | 1020140126602 A | 10/2014 |

* cited by examiner

PRESSURE SENSOR DEVICE AND MANUFACTURING METHOD THEREOF

TECHNICAL FIELD

The present invention relates to a pressure sensor device and a method of manufacturing the same and, more particularly, to a pressure sensor device capable of detecting a water level, and a method of manufacturing the same.

BACKGROUND ART

In general, a washing machine is a device for cleaning laundry by washing, rinsing, and spin-drying clothes using a detergent and water supplied into a tub. The washing machine includes a pressure sensor capable of properly controlling water supply based on a water level preset in a controller or manually set by a user.

The pressure sensor has a structure in which a metal coil and a magnetic bar move based on a variation in air pressure due to a variation in the water level of a target device, and operates due to frequency oscillation based on a variation in inductance.

Since steam washing machines are currently commercialized, research is being actively conducted on a pressure sensor capable of precisely detecting a water level. However, a pressure sensor may detect an output frequency variation of several kHz, and may not precisely detect a water level because an output value varies in the form of a non-linear quadratic curve. Furthermore, an excessively high pressure may be applied to the pressure sensor due to excessive steam or the pressure of continuously supplied water and, in a worse case, the pressure sensor may be damaged or broken.

DETAILED DESCRIPTION OF THE INVENTION

Technical Problem

The present invention provides a pressure sensor device capable of precisely detecting a water level and of preventing damage caused by laundry water, and a method of manufacturing the same. However, the scope of the present invention is not limited thereto.

Technical Solution

According to an aspect of the present invention, there is provided a pressure sensor device including a housing including an air inlet and a fluid inlet provided in different directions, a substrate provided in an inner space of the housing and including a through-hole through which the air passes, and a pressure sensor chip mounted on the substrate to cover the through-hole in such a manner that a pressure of a fluid flowing in from the fluid inlet is applied to a top surface thereof and a bottom surface thereof is exposed to the air through the through-hole, in order to measure the pressure of the fluid relative to a pressure of the air, wherein the inner space is divided into an upper region and a lower region with respect to the substrate, and wherein the upper region is divided into a first inner region in which the pressure sensor chip is provided and a second inner region through which the air passes.

The housing may be divided into an upper housing and a lower housing with respect to the substrate, and the upper housing may include a barrier having a contact with the substrate and capable of dividing the first and second inner regions from each other.

The pressure sensor device may further include a pressure transmission medium provided in the first inner region to protect the pressure sensor chip and capable of transmitting the pressure of the fluid to allow the pressure sensor chip to measure the pressure.

A space through which the air flowing in from the air inlet moves and a space in which the pressure transmission medium is providable may be divided from each other by the barrier.

The barrier may be bonded to a top surface of the substrate, the upper housing may be bonded onto the barrier, and the lower housing may be bonded to a bottom surface of the substrate.

The lower housing may be in contact with the substrate and may be connected to the air inlet.

The air inlet and the fluid inlet may extend in directions perpendicular to each other.

The pressure transmission medium may have a waterproofing capability to prevent direct contact between the fluid and the pressure sensor chip.

The pressure transmission medium may include gel having a shape variable depending on the pressure of the fluid.

The pressure transmission medium may include silicone or epoxy having a shape variable depending on the pressure of the fluid.

The substrate and the pressure sensor chip may be electrically connected to each other using conductive leads, and the pressure sensor chip and the conductive leads may be encapsulated using the pressure transmission medium.

The pressure sensor device may further include an integrated circuit (IC) chip mounted on the substrate to convert an analog signal output generated by the pressure sensor chip, into a digital signal output.

The pressure sensor device may have a connected structure in which the air flowing in through the air inlet moves through the second inner region to the lower region and reaches the pressure sensor chip exposed by the through-hole.

According to another aspect of the present invention, there is provided a pressure sensor device including a substrate including a first through-hole and a second through-hole, a pressure sensor chip mounted on the substrate to cover the first through-hole in such a manner that a bottom surface thereof is exposed to the air through the first through-hole, in order to measure a pressure of a fluid relative to a pressure of the air, a barrier bonded to a top surface of the substrate to protect the pressure sensor chip and to define an inner space, an upper housing bonded onto the barrier to protect at least a part of the pressure sensor chip, and including an air inlet and a fluid inlet provided in different directions, and a lower housing bonded to a bottom surface of the substrate to protect the pressure sensor chip and to provide a passage in which the air flowing in through the air inlet sequentially passes through the second through-hole and the first through-hole.

The inner space may be divided with respect to the barrier into a first inner region in which the pressure sensor chip is provided and a second inner region through which the air passes.

According to another aspect of the present invention, there is provided a pressure sensor device including a substrate including a first through-hole and a second through-hole, a housing surrounding at least a part of the substrate to provide the first and second through-holes therein, and including a first surface in which a fluid inlet is provided and a second surface in which an air inlet is provided and which is different from the first surface, and a pressure sensor chip mounted on the substrate in order to measure a pressure of a fluid, which is applied to the fluid inlet, relative to a pressure of the air, which is applied to the air inlet, wherein the housing includes a first inner region connected to the fluid inlet to receive the pressure of the fluid, and a second inner region connected to the air inlet to receive the pressure of the air and divided from the first inner region by an inner wall on the substrate between the first and second through-holes, and wherein the pressure sensor chip is mounted on the first through-hole such that a surface thereof is provided in the first inner region and another surface thereof receives the pressure of the air of the second inner region through the first through-hole.

The first surface may be a top surface of the housing, the second surface may be a side surface of the housing, and the fluid inlet and the air inlet may be provided above a front surface of the substrate.

The first and second surfaces may be provided in directions perpendicular to each other.

The pressure sensor device may further include a pressure transmission medium capable of encapsulating the pressure sensor chip and of transmitting the pressure of the fluid to allow the pressure sensor chip to measure the pressure.

According to another aspect of the present invention, there is provided a method of manufacturing a pressure sensor device, the method including preparing a substrate including two or more through-holes through which the air passes, mounting a pressure sensor chip on the substrate to cover the through-hole in such a manner that a bottom surface thereof is exposed to the air through the through-hole, in order to measure a pressure of a fluid relative to a pressure of the air, providing an integrated circuit (IC) chip on the substrate, providing a barrier having a contact with the substrate and capable of defining an inner space, to protect the pressure sensor chip and the IC chip, providing a pressure transmission medium capable of encapsulating at least parts of the pressure sensor chip and the IC chip, in the inner space, providing a lower housing on a bottom surface of the substrate to protect the pressure sensor chip exposed by the through-hole, and providing an upper housing including an air inlet and a fluid inlet provided in different directions, on the barrier.

ADVANTAGEOUS EFFECTS

As described above, according to an embodiment of the present invention, a pressure sensor device having a small size and capable of saving water and reducing power consumption by precisely controlling a water level, and of preventing damage caused by laundry water, and a method of manufacturing the same may be implemented. However, the scope of the present invention is not limited thereto.

MODE OF THE INVENTION

Figure 1:
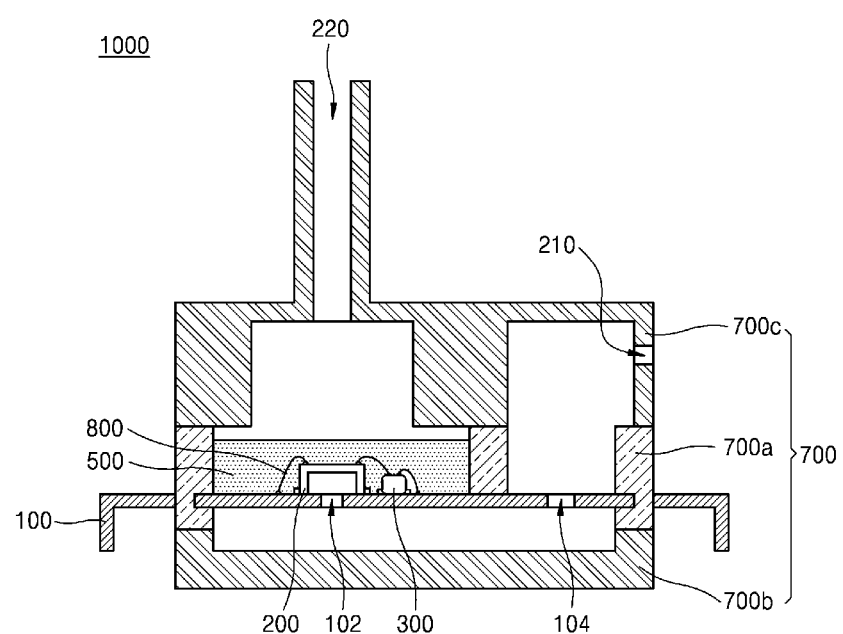
FIG. 1 is a schematic view showing the configuration of a pressure sensor device according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a schematic view showing the configuration of a pressure sensor device 1000 according to an embodiment of the present invention.

Referring to FIG. 1, the pressure sensor device 1000 according to an embodiment of the present invention may use lead frames as a substrate 100. Although not shown in FIG. 1, when lead frames are used as the substrate 100, a mould (not shown) may be used to mold and connect the lead frames.

The substrate 100 may include two or more through-holes 102 and 104. The first and second through-holes 102 and 104 may serve as passages through which the air flows in, and may be connected to an air inlet 210 of an upper housing 700c to be described below.

A pressure sensor chip 200 may be mounted on the substrate 100 in order to measure a pressure of a fluid, which is applied through a fluid inlet 220, relative to a pressure of the air, which is applied through the air inlet 210. The pressure sensor chip 200 may cover the first through-hole 102 and the pressure of the fluid flowing in from the fluid inlet 220 may be applied thereto. A bottom surface of the pressure sensor chip 200 may be exposed to the air through the first through-hole 102. Before the pressure sensor chip 200 is mounted on the substrate 100, a silicone pattern 202 may be provided in a region where the pressure sensor chip 200 is to be provided. The silicone pattern 202 may serve as an adhesive to fix the pressure sensor chip 200 onto the substrate 100. Herein, the fluid may include a liquid or a gas, and the pressure sensor chip 200 is well known and thus a detailed description thereof is omitted.

An integrated circuit (IC) chip 300 capable of converting an analog signal output generated by the pressure sensor chip 200, into a digital signal output may be mounted on the substrate 100 in the same manner as the pressure sensor chip 200. Herein, the IC chip 300 may be understood as, for example, an analog front end.

At least any two selected from among the substrate 100, the pressure sensor chip 200, and the IC chip 300 may be electrically connected to each other using conductive leads 800. For example, the pressure sensor chip 200 and the IC chip 300 may be electrically connected to the substrate 100 using the conductive leads 800 through a wire bonding process, and may also be electrically connected to each other using the conductive leads 800.

A housing 700 may include a barrier 700a, a lower housing 700b, and the upper housing 700c. For example, the barrier 700a may be bonded to at least a part of the substrate 100. The lower housing 700b may be located under the substrate 100 and may be bonded to the barrier 700a. In addition, the upper housing 700c may be bonded onto the barrier 700a. The upper housing 700c may include the air inlet 210 and the fluid inlet 220 provided in different directions.

Herein, for example, in the upper housing 700c including a first surface and a second surface different from the first surface, the fluid inlet 220 may be provided in the first surface and the air inlet 210 may be provided in the second surface. The first and second surfaces may be provided in perpendicular directions. In this case, the first surface may be understood as a top surface of the upper housing 700c, the second surface may be understood as a side surface of the upper housing 700c, and both of the fluid inlet 220 and the air inlet 210 may be provided above the top surface of the substrate 100.

Although the air inlet 210 and the fluid inlet 220 included in the upper housing 700c are provided in perpendicular directions as an example, the directions of the air inlet 210 and the fluid inlet 220 may vary depending on the location, size, and structure of the barrier 700a. The barrier 700a, the lower housing 700b, and the upper housing 700c may be made of the same material or different materials.

The air inlet 210 is provided in the side surface of the upper housing 700c. Although the air inlet 210 is represented as penetrating a side surface of the upper housing 700c, if assembled with an external device, the air inlet 210 may also be designed to protrude from the upper housing 700c like the fluid inlet 220 depending on the shape of the external device.

The air inlet 210 and the fluid inlet 220 may have the same diameter, or any of the two may have a larger diameter. The air inlet 210 and the fluid inlet 220 may have different external diameters, and the shapes of the air inlet 210 and the fluid inlet 220 may be determined depending on parts thereof to be connected or coupled to the external device. On the other hand, the sizes and directions of the air inlet 210 and the fluid inlet 220 may be designed to differ depending on the location of the pressure sensor chip 200 in the pressure sensor device 1000, the locations of the through-holes 102 and 104 in the substrate 100, the height of the barrier 700a, the location of each sensor chip, or the like.

The pressure sensor device 1000 includes an inner space surrounded by outer walls of the housing 700. The inner space is divided with respect to the substrate 100 into an upper region on a top surface of the substrate 100 and a lower region under a bottom surface of the substrate 100. The upper region may be divided by an inner wall of the upper housing 700c into a first inner region in which the pressure sensor chip 200 is provided and a second inner region through which the air passes. The fluid inlet 220 through which the fluid moves may be provided in the first inner region, and the air inlet 210 may be provided in the second inner region.

The lower region is defined by the lower housing 700b, and serves as a passage through which the air passes, by covering the first and second through-holes 102 and 104 through which the air passes. On the other hand, a top surface of the barrier 700a may be in contact with the upper housing 700c to divide the first and second inner regions from each other. The inner wall of the upper housing 700c, which divides the first and second inner regions from each other, may be in contact with at least a part of the barrier 700a, and the first and second inner regions may be divided from each other with respect to the contact part.

The barrier 700a may surround at least a part of the substrate 100 to provide the first and second through-holes 102 and 104 of the substrate 100 therein. The barrier 700a may be in contact with the substrate 100 and define the inner space and thus a pressure transmission medium 500 may be precisely provided in the inner space. The pressure transmission medium 500 may be filled in the inner space to encapsulate at least a part of the substrate 100, the pressure sensor chip 200, the IC chip 300, and the conductive leads 800 for electrically connecting the chips 200 and 300. Herein, the pressure transmission medium 500 may use, for example, a silicone-based material (having a Young's modulus of 0.001 GPa to 0.05 GPa) or an epoxy-based material (having a Young's modulus of 2.0 GPa to 20.0 GPa), which is used to protect semiconductor ICs and microelectromechanical system (MEMS) sensors. The above two materials have excellent waterproof functions, and a pressure transmission function of the silicone-based material is superior to that of the epoxy-based material due to the Young's moduli thereof. The Young's modulus refers to a vertical elastic modulus, and a small Young's modulus means excellent contraction, i.e., excellent pressure transmission.

The pressure transmission medium 500 may be fluidic in such a manner that an electrical signal (e.g., a frequency) is generated when the pressure of the fluid is applied to a diaphragm (not shown) provided on the pressure sensor chip 200. Each of the above materials may use a gel-type material capable of performing a function of transmitting the pressure of the fluid to the diaphragm and a waterproof function. The gel is produced by solidifying a colloid solution to a certain or higher density like jelly, and force of the pressure applied to the pressure transmission medium 500 provided on the diaphragm may be constantly transmitted to the diaphragm.

The pressure transmission medium 500 may cover the surfaces of the chips 200 and 300 to a very small thickness in such a manner that the pressure is applied to the diaphragm. Accordingly, the pressure transmission medium 500 may prevent damage of the pressure sensor chip 200 against an electrical defect due to external moisture or an excessive water pressure.

When lead frames are used as the substrate 100, the barrier 700a and the lower housing 700b may be integrated with each other. In this case, the lower housing 700b may be omitted. The barrier 700a may serve as the lower housing 700b to protect the pressure sensor chip 200 and to provide a fluid passage through which the air moves. The upper housing 700c may be assembled onto the barrier 700a thereafter. As such, the pressure sensor device 1000 having a small size and capable of precisely controlling a water level to save water and to reduce power consumption may be implemented.

The barrier 700a may be molded integrally with the lead frame substrate 100. In this case, the mould may not be used and the barrier 700a may be insert-injection-molded integrally with the substrate 100. At this time, the barrier 700a provided on the top surface of the substrate 100 may have a height less than that of the barrier 700a of pressure sensor devices to be described below.

Accordingly, a passage connected to the fluid inlet 220 and the air inlet 210 of the upper housing 700c may have a long length. On the other hand, when the upper housing 700c having the same size as that of pressure sensor devices using other types of substrates, since the barrier 700a has a small height, the passage connected to the fluid inlet 220 and the air inlet 210 may have a short length.

FIGS. 2 to 9 are perspective views for describing a method of manufacturing the pressure sensor device 1000 illustrated in FIG. 1.

FIGS. 2 to 9 illustrate sequential processes of manufacturing the pressure sensor device 1000, and detailed descriptions of the substrate 100, the pressure sensor chip 200, the IC chip 300, the pressure transmission medium 500, and the housing 700 have been provided above in relation to FIG. 1 and thus are omitted.

Figure 2:
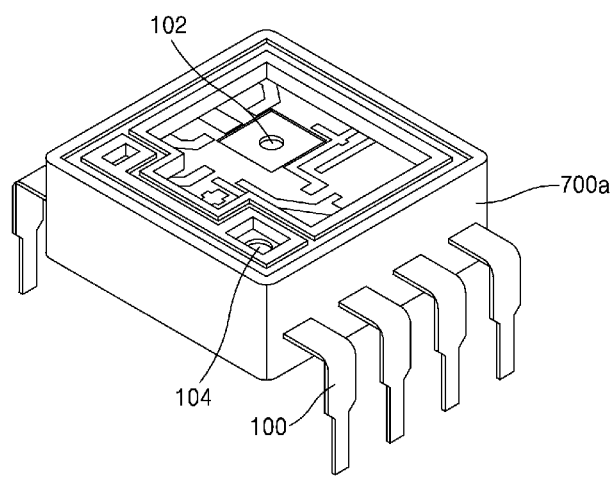
FIGS. 2 to 9 are perspective views for describing a method of manufacturing the pressure sensor device illustrated in FIG. 1.
Figure 3:
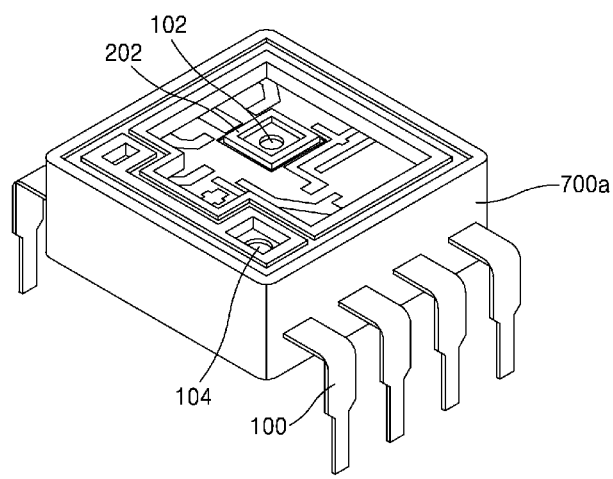
Figure 4:
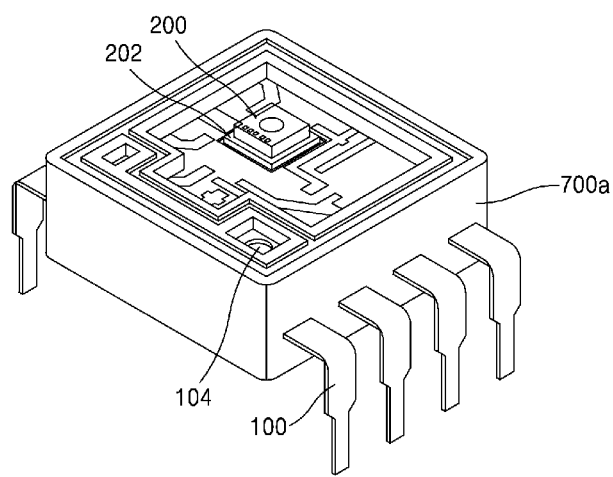
Figure 5:
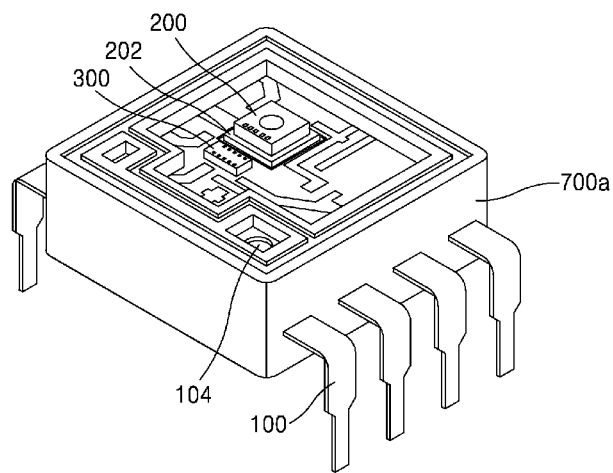
Figure 6:
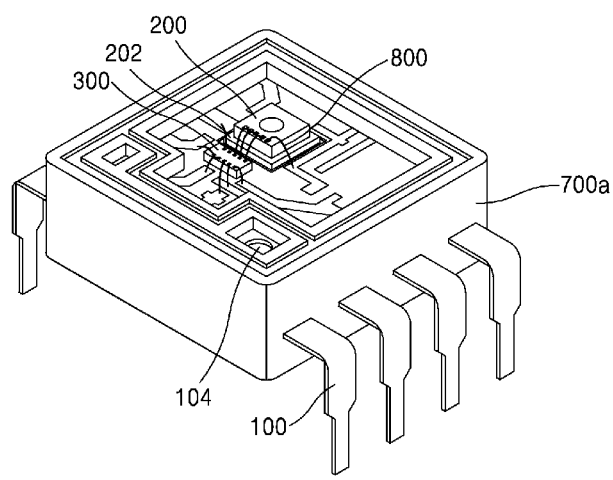
Figure 7:
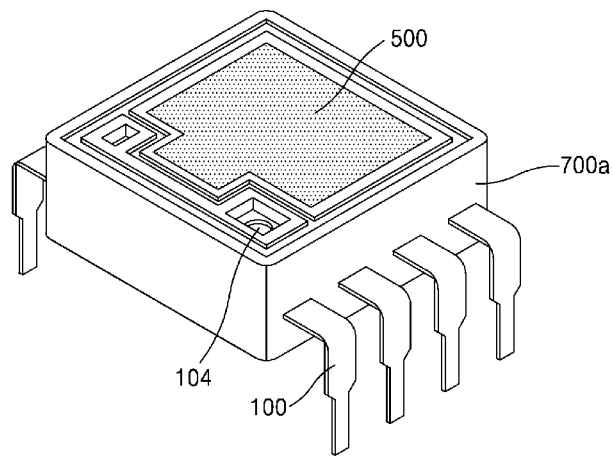

Initially, referring to FIG. 2, the lead frame substrate 100 including the first and second through-holes 102 and 104 may be prepared. When lead frames are used as the substrate 100, the lead frames may be molded and connected using a mould. Herein, the barrier 700a may not be separately generated and bonded onto the substrate 100 but may be insert-injection-molded integrally with a plurality of lead frames, and thus an integrated substrate may be used. The first and second through-holes 102 and 104 may serve as passages through which the air flows in, and may be connected to the air inlet 210 of the upper housing 700c to be described below in relation to FIG. 9.

Referring to FIGS. 3 to 7, the pressure sensor chip 200 may be generated and mounted on the substrate 100 to cover the first through-hole 102 in such a manner that a bottom surface thereof is exposed to the air through the first through-hole 102, in order to measure a pressure of a fluid relative to a pressure of the air. Before that, the silicone pattern 202 capable of serving as an adhesive may be generated on edges of the pressure sensor chip 200 to fix the pressure sensor chip 200.

The IC chip 300 capable of converting an analog signal output generated by the pressure sensor chip 200, into a digital signal output may be generated and mounted on the same surface of the substrate 100 as and in the same manner as the pressure sensor chip 200. The substrate 100, the pressure sensor chip 200, and the IC chip 300 may be electrically connected to each other using the conductive leads 800.

The pressure sensor device 1000 according to an embodiment of the present invention may further include a regulator (not shown) mounted on the substrate 100 and capable of maintaining a constant voltage. The regulator may be understood as, for example, a low dropout (LDO) regulator. Herein, the regulator may be used or not used depending on a combination of a sensor and an IC. The regulator is well known and thus a detailed description thereof is omitted.

The pressure transmission medium 500 may be precisely generated in an inner space defined by the barrier 700a provided on at least a part of the substrate 100 of FIG. 2. The pressure transmission medium 500 may be filled in the inner space to encapsulate at least a part of the substrate 100, the pressure sensor chip 200, the IC chip 300, the regulator, and the conductive leads 800 for electrically connecting the chips 200 and 300.

Figure 8:
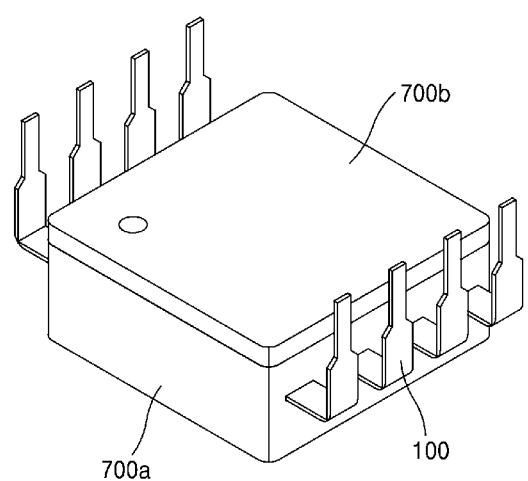
Figure 9:
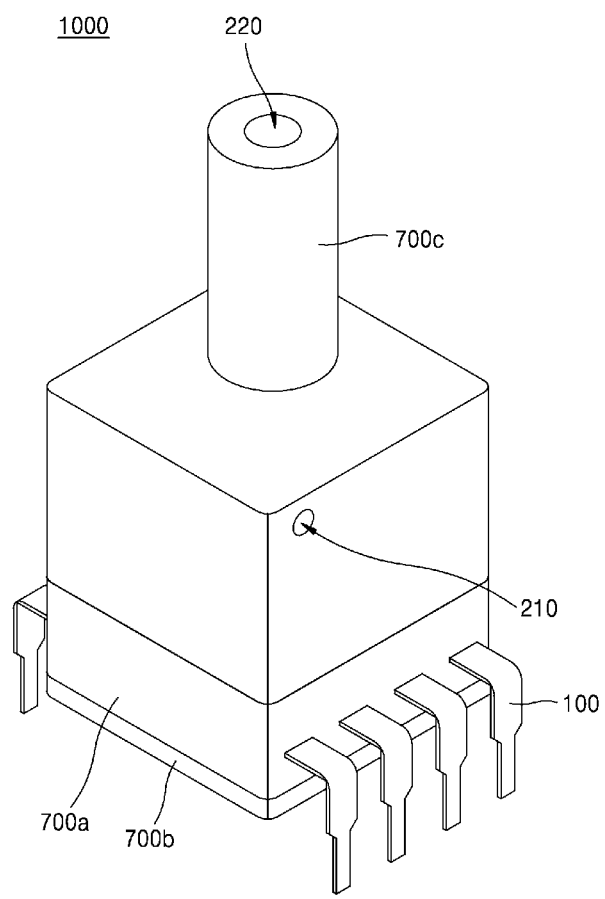

Referring to FIGS. 8 and 9, the lower housing 700b may be generated under the substrate 100.

Initially, referring to FIG. 8, the lower housing 700b may be bonded to a part of the barrier 700a provided on a bottom surface of the substrate 100. The lower housing 700b may provide a passage through which the air flowing into the pressure sensor device 1000 reaches the bottom surface of the pressure sensor chip 200 and moves to measure a standard pressure.

Referring to FIG. 9, lastly, the upper housing 700c including the air inlet 210 through which the air flows in and the fluid inlet 220 through which the fluid flows in and which is provided in a direction different from that of the air inlet 210 may be bonded onto the barrier 700a, thereby manufacturing the pressure sensor device 1000.

Figure 10:
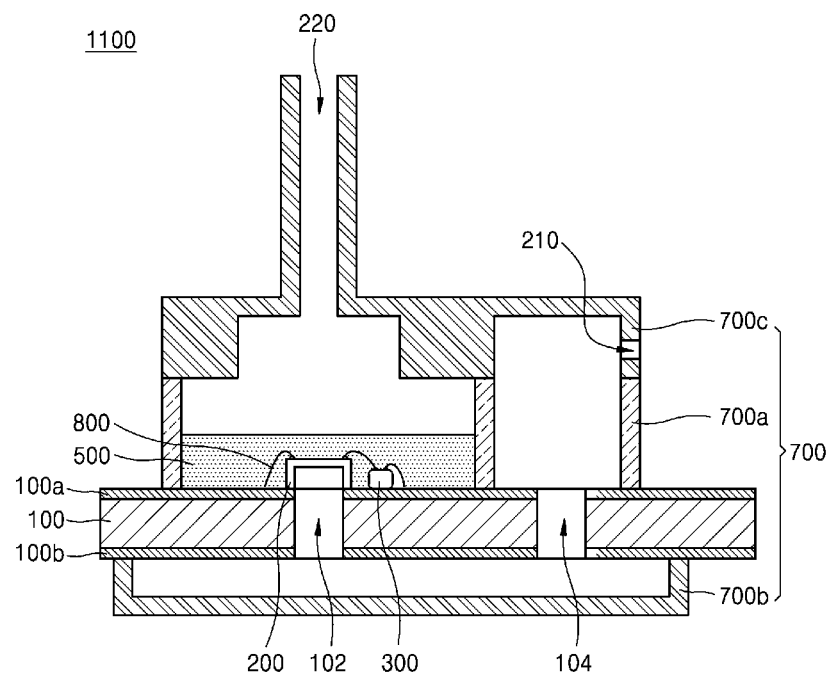
FIG. 10 is a schematic view showing the configuration of a pressure sensor device according to another embodiment of the present invention.

FIG. 10 is a schematic view showing the configuration of a pressure sensor device 1100 according to another embodiment of the present invention.

Referring to FIG. 10, a cross-sectional view of the pressure sensor device 1100 according to another embodiment of the present invention is shown. Initially, the pressure sensor device 1100 may include the housing 700 provided on the substrate 100. The substrate 100 may use, for example, a printed circuit board (PCB). It may be understood that resist layers of the PCB are generally provided on a top surface 100a and a bottom surface 100b of the substrate 100.

The housing 700 may include the barrier 700a, the lower housing 700b, and the upper housing 700c. For example, the barrier 700a may be bonded onto at least a part of the substrate 100. The lower housing 700b may be bonded to at least a part of the bottom surface 100b of the substrate 100. The upper housing 700c may be bonded onto the barrier 700a. The upper housing 700c may include the air inlet 210 and the fluid inlet 220 provided in different non-parallel directions.

Herein, for example, in the upper housing 700c including a first surface and a second surface different from the first surface, the fluid inlet 220 may be provided in the first surface and the air inlet 210 may be provided in the second surface. The first and second surfaces may be provided in perpendicular directions. The first surface may be understood as a top surface of the upper housing 700c, the second surface may be understood as a side surface of the upper housing 700c, and both of the fluid inlet 220 and the air inlet 210 may be provided above the top surface 100a of the substrate 100.

Herein, detailed descriptions of the pressure sensor chip 200, the IC chip 300, and the pressure transmission medium 500 have been provided above in relation to FIG. 1 and thus are omitted.

The housing 700 includes the barrier 700a, the lower housing 700b, and the upper housing 700c, and includes an inner space surrounded by outer walls of the housing 700. The inner space is divided with respect to the substrate 100 into an upper region on the top surface 100a of the substrate 100 and a lower region under the bottom surface 100b of the substrate 100. The upper region may be divided by an inner structure, e.g., an inner wall, of the upper housing 700c into a first inner region in which the pressure sensor chip 200 is provided and a second inner region through which the air passes. The fluid inlet 220 through which a fluid moves may be provided in the first inner region, and the air inlet 210 may be provided in the second inner region.

The lower region is defined by the lower housing 700b, and serves as a passage through which the air passes, by covering the first and second through-holes 102 and 104 through which the air passes. On the other hand, the top surface of the barrier 700a may be in contact with the upper housing 700c to divide the first and second inner regions from each other. The inner structure of the upper housing 700c, which divides the first and second inner regions from each other, may be in contact with at least a part of the barrier 700a, and the first and second inner regions may be divided from each other with respect to the contact part. Accordingly, the barrier 700a may divide at least a part of the substrate 100 into the first and second inner regions and thus the pressure transmission medium 500 may be accurately filled in the first inner region where the pressure sensor chip 200 is provided.

The pressure transmission medium 500 may be filled in the inner space defined by the barrier 700a and then the lower housing 700b may be provided under the substrate 100, thereby providing a passage through which the air moves.

The upper housing 700c may be assembled onto the barrier 700a after the barrier 700a and the lower housing 700b are bonded, thereby manufacturing the pressure sensor device 1100. Although the air inlet 210 and the fluid inlet 220 of the upper housing 700c are provided in perpendicular directions as an example, the directions thereof may vary depending on the location and size of the barrier 700a.

As described above, the pressure sensor device 1100 may be manufactured by bonding the barrier 700a, the lower housing 700b, and the upper housing 700c onto the substrate 100. When a PCB is used as the substrate 100, the pressure sensor device 1100 may be easily manufactured without additionally performing a molding process.

The housing 700 may include the first inner region connected to the fluid inlet 220 to receive the pressure of the fluid, and the second inner region connected to the air inlet 210 to receive the pressure of the air and divided from the first inner region by the inner wall on the substrate 100 between the first and second through-holes 102 and 104. The pressure sensor chip 200 may be mounted on the first through-hole 102 such that a surface thereof may be provided in the first inner region and another surface thereof may receive the pressure of the air of the second inner region through the first through-hole 102.

FIGS. 11 to 19 are perspective views for describing a method of manufacturing the pressure sensor device 1100 illustrated in FIG. 10.

FIGS. 11 to 19 illustrate sequential processes of manufacturing the pressure sensor device 1100, and detailed descriptions of the substrate 100, the pressure sensor chip 200, the IC chip 300, the pressure transmission medium 500, and the housing 700 have been provided above in relation to FIGS. 1 to 10 and thus are omitted.

Figure 11:
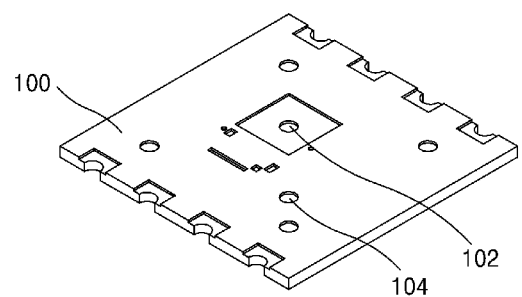
FIGS. 11 to 19 are perspective views for describing a method of manufacturing the pressure sensor device illustrated in FIG. 10.

Referring to FIG. 11, a PCB 100 including two or more through-holes may be prepared. The through-holes may include the first and second through-holes 102 and 104.

Figure 12:
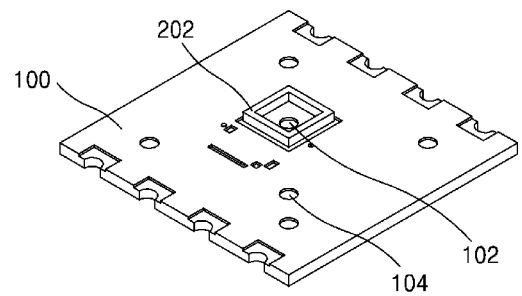
Figure 13:
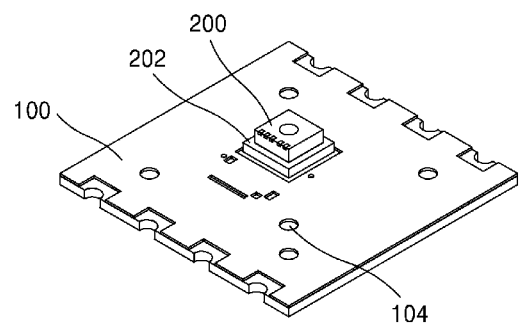

Referring to FIGS. 12 and 13, the pressure sensor chip 200 may be generated and mounted on the substrate 100 to cover the first through-hole 102 in such a manner that a pressure of a fluid flowing in from the fluid inlet 220 to be described below is applied to a top surface thereof and a bottom surface thereof is exposed to the air through the first through-hole 102, in order to measure the pressure of the fluid relative to a pressure of the air. Before that, the silicone pattern 202 capable of serving as an adhesive may be generated on edges of the pressure sensor chip 200 to fix the pressure sensor chip 200.

Figure 14:
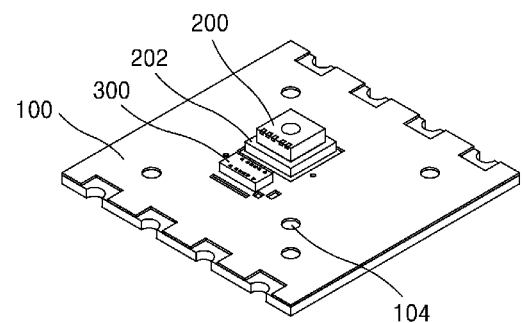
Figure 15:
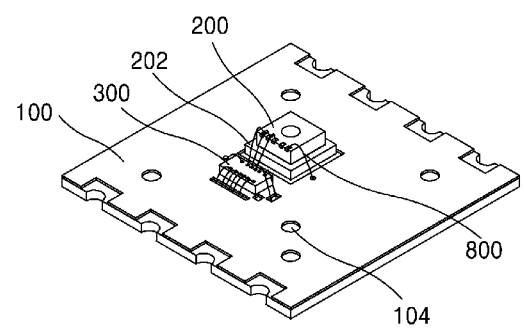

Referring to FIGS. 14 and 15, the IC chip 300 capable of converting an analog signal output generated by the pressure sensor chip 200, into a digital signal output may be generated and mounted on the same surface of the substrate 100 as and in the same manner as the pressure sensor chip 200. At least any two selected among the substrate 100, the pressure sensor chip 200, and the IC chip 300 may be electrically connected to each other using the conductive leads 800.

Figure 16:
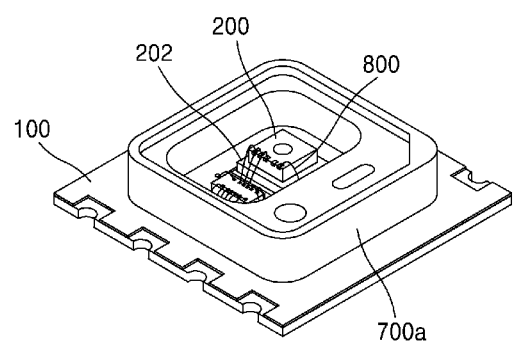
Figure 17:
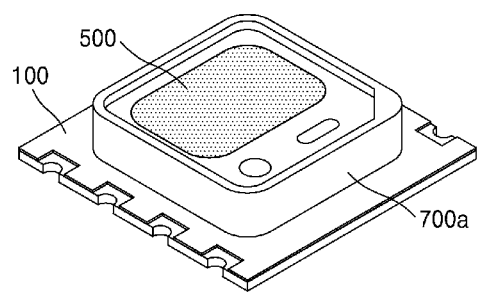

Referring to FIGS. 16 and 17, the barrier 700a may be bonded to at least a part of the top surface 100a of the substrate 100. The barrier 700a may surround at least a part of the substrate 100 to provide the first and second through-holes 102 and 104 of the substrate 100 therein. The barrier 700a may be in contact with the substrate 100 and define the inner space and thus a pressure transmission medium 500 may be precisely provided in the inner space. The pressure transmission medium 500 may be filled in the inner space to encapsulate at least a part of the substrate 100, the pressure sensor chip 200, the IC chip 300, and the conductive leads 800 for electrically connecting the chips 200 and 300.

Figure 18:
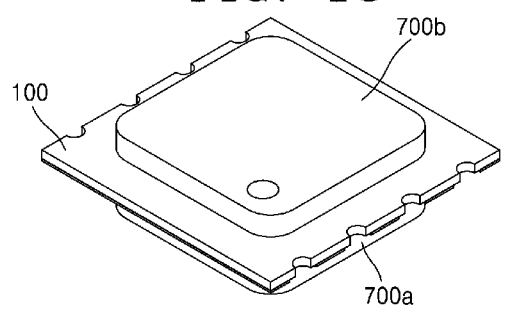
Figure 19:
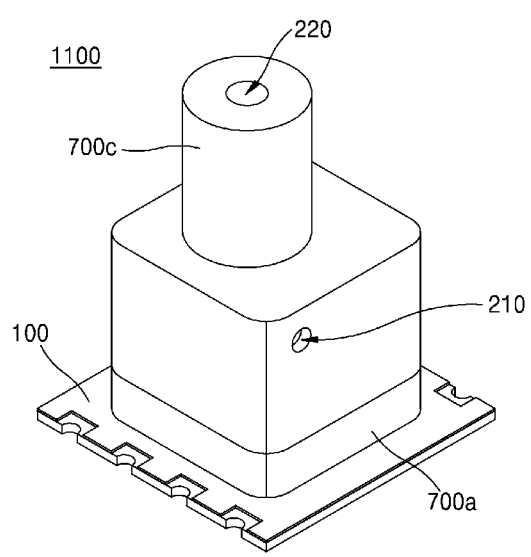

Referring to FIGS. 18 and 19, the lower housing 700b may be generated under the substrate 100.

Initially, referring to FIG. 18, the lower housing 700b may be bonded to at least a part of the bottom surface 100b of the substrate 100. The lower housing 700b may provide a passage through which the air flowing into the pressure sensor device 1100 reaches the bottom surface of the pressure sensor chip 200 and moves to measure a standard pressure.

Referring to FIG. 19, lastly, the upper housing 700c including the air inlet 210 through which the air flows in and the fluid inlet 220 through which the fluid flows in may be bonded onto the barrier 700a, thereby manufacturing the pressure sensor device 1100.

The air inlet 210 and the fluid inlet 220 may be provided in different non-parallel directions. For example, the air inlet 210 and the fluid inlet 220 may extend in perpendicular directions. That is, base on FIG. 19, the fluid inlet 220 extends upward from a top surface the upper housing 700c. The air inlet 210 is provided in a side surface of the upper housing 700c. Although the air inlet 210 is represented as penetrating a side surface of the upper housing 700c, if assembled with an external device, the air inlet 210 may also be designed to protrude from the upper housing 700c like the fluid inlet 220 depending on the shape of the external device.

Figure 20:
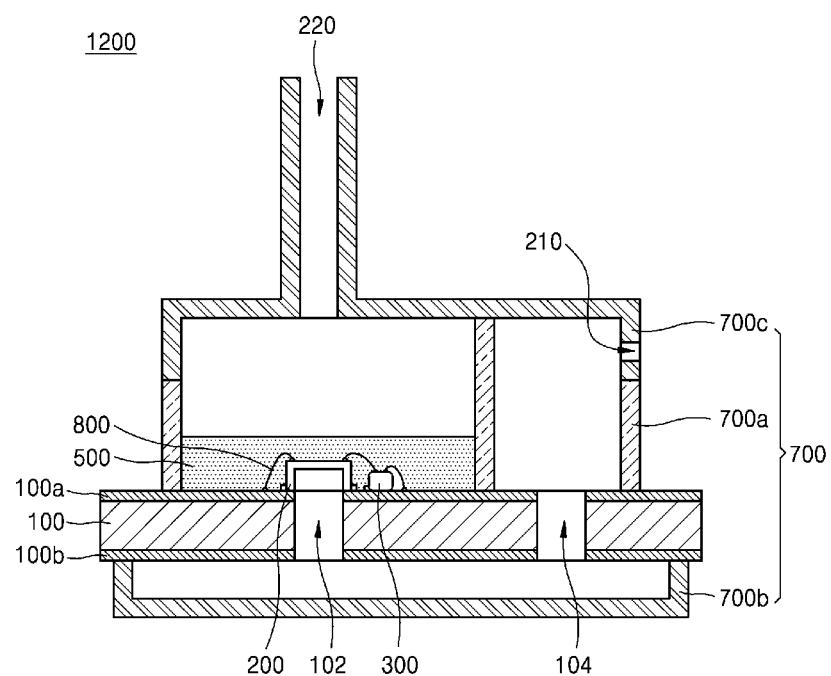
FIG. 20 is a schematic view showing the configuration of a pressure sensor device according to another embodiment of the present invention.

FIG. 20 is a schematic view showing the configuration of a pressure sensor device 1200 according to another embodiment of the present invention.

The structure of the pressure sensor device 1200 illustrated in FIG. 20 is similar to that of the pressure sensor device 1100 described above in relation to FIG. 10, but the height of the barrier 700a or the inner structure of the upper housing 700c differs therefrom. When the height of the barrier 700a provided between the first inner region in which the pressure sensor chip 200 is provided and the second inner region including a passage through which the air flows in is high, the air inlet 210 may be bent in a right direction. In this case, the first and second inner regions are divided from each other not by the upper housing 700c but by the barrier 700a. In this case, outer walls of the upper housing 700c may be stepped to be coupled to the barrier 700a.

Although now shown in FIG. 20, the upper housing 700c may include only the fluid inlet 220 and, in this case, the air inlet 210 may be provided at a side of the barrier 700a. When the substrate 100 does not include the second through-hole 104 through which the air passes, the air inlet 210 may be provided at any side of the lower housing 700b.

Figure 21:
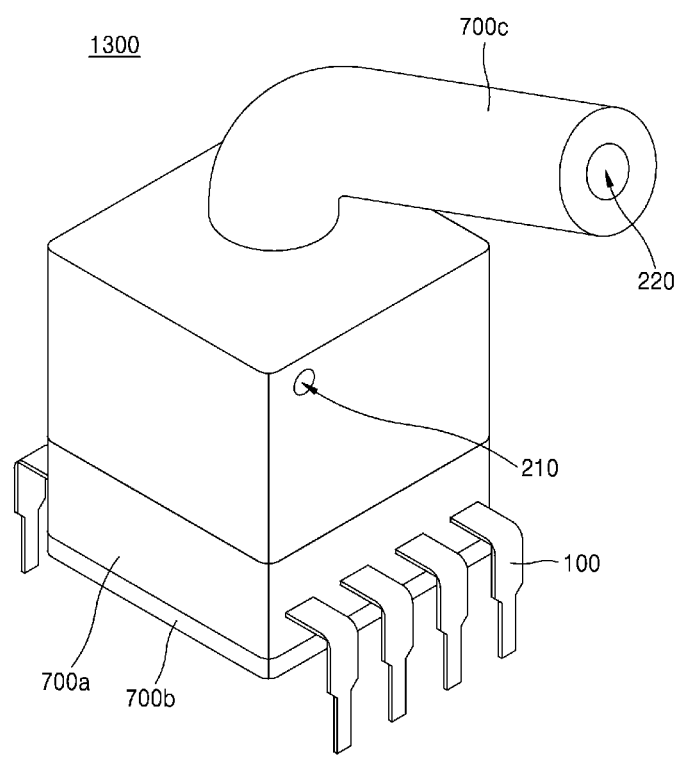
FIG. 21 is a perspective view showing the configuration of a pressure sensor device according to another embodiment of the present invention.

FIG. 21 is a perspective view showing the configuration of a pressure sensor device 1300 according to another embodiment of the present invention.

Referring to FIG. 21, the inner structure of the pressure sensor device 1300 is similar to that of the pressure sensor device 1000 described above in relation to FIG. 1, but the shape of the fluid inlet 220 of the upper housing 700c differs therefrom. The fluid inlet 220 may be inclined by a predetermined angle from a top surface of the upper housing 700c in a direction perpendicular to the top surface. Although the fluid inlet 220 is inclined toward a direction in which the air inlet 210 is provided, as an example in FIG. 21, the direction and length of the fluid inlet 220 may vary to be easily coupled to a coupling part of an external device such as a washing machine, through which water moves.

Figure 22:
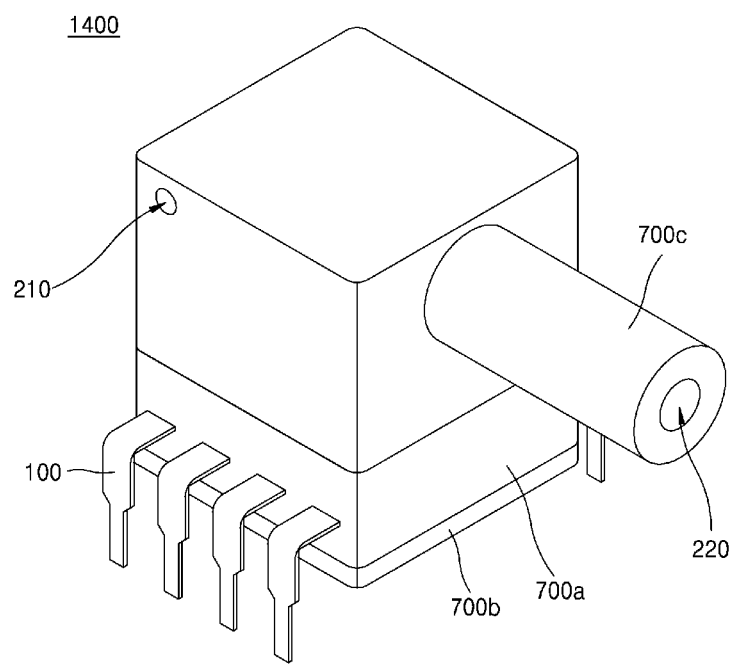
FIG. 22 is a perspective view showing the configuration of a pressure sensor device according to another embodiment of the present invention.

FIG. 22 is a perspective view showing the configuration of a pressure sensor device 1400 according to another embodiment of the present invention.

Referring to FIG. 22, the inner structure of the pressure sensor device 1400 is similar to that of the pressure sensor device 1000 described above in relation to FIG. 1, but the shape of the fluid inlet 220 of the upper housing 700c differs therefrom. The fluid inlet 220 may be provided in any side surface of the upper housing 700c. In this case, the fluid inlet 220 and the air inlet 210 may be provided in perpendicular directions.

However, depending on the inner structure of the pressure sensor device 1400, the fluid inlet 220 may be provided in a surface facing the surface in which the air inlet 210 is provided, or in the same surface in which the air inlet 210 is provided. In some cases, as illustrated in FIG. 21, the fluid inlet 220 may be inclined from the side surface of the upper housing 700c in a direction of a top surface of the upper housing 700c or a direction parallel to the top surface and may be coupled to a coupling part of an external device.

The pressure sensor devices 1000, 1100, 1200, 1300, and 1400 described above in relation to FIGS. 1 to 22 according to embodiments of the present invention may have a structure easily couplable to an external device. The directions and structures of the air inlet 210 and the fluid inlet 220 may be designed to vary depending on the inner structure of the device, the height of a barrier, or the like.

As described above, according to the present invention, device defects in a pressure sensor chip, an IC chip, etc. due to a fluid or moisture may be prevented by employing a pressure transmission medium. Although a waterproof function of a pressure sensor device may be weak because the pressure sensor device is attached below a fluid inlet, since the pressure sensor device is surrounded by a housing having a waterproof function and a protection function, defects due to moisture may be prevented.

Furthermore, since characteristics of the sensor are changed if the pressure transmission medium is hardened, the pressure sensor may properly operate by employing a barrier structure to fix a low-viscosity waterproof-gel-type pressure transmission medium. In addition, since the housing has a separable structure and the fluid inlet and an air inlet are provided in different non-parallel directions, a pressure sensor device having excellent productivity due to automatic assembly or the like, having a simple structure, and capable of easily mounting the sensor chip and the IC chip in a manufacturing process may be implemented.

While the present invention has been particularly shown and described with reference to embodiments thereof, it will be understood by one of ordinary skill in the art that various changes in form and details may be made therein without departing from the spirit and scope of the present invention as defined by the following claims.

The invention claimed is:

1. A pressure sensor device comprising:
a housing comprising an air inlet and a fluid inlet provided in different directions;
a substrate provided in an inner space of the housing and comprising a through-hole through which the air passes; and
a pressure sensor chip mounted on the substrate to cover the through-hole in such a manner that a pressure of a fluid flowing in from the fluid inlet is applied to a top surface thereof and a bottom surface thereof is exposed to the air through the through-hole, in order to measure the pressure of the fluid relative to a pressure of the air,
wherein the inner space is divided into an upper region and a lower region with respect to the substrate, and
wherein the upper region is divided into a first inner region in which the pressure sensor chip is provided and a second inner region through which the air passes.

2. The pressure sensor device of claim 1, wherein the housing is divided into an upper housing and a lower housing with respect to the substrate, and
wherein the upper housing comprises a barrier having a contact with the substrate and capable of dividing the first and second inner regions from each other.

3. The pressure sensor device of claim 2, further comprising a pressure transmission medium provided in the first inner region to protect the pressure sensor chip and capable of transmitting the pressure of the fluid to allow the pressure sensor chip to measure the pressure.

4. The pressure sensor device of claim 3, wherein a space through which the air flowing in from the air inlet moves and a space in which the pressure transmission medium is providable are divided from each other by the barrier.

5. The pressure sensor device of claim 2, wherein the barrier is bonded to a top surface of the substrate,
wherein the upper housing is bonded onto the barrier, and
wherein the lower housing is bonded to a bottom surface of the substrate.

6. The pressure sensor device of claim 2, wherein the lower housing is in contact with the substrate and is connected to the air inlet.

7. The pressure sensor device of claim 1, wherein the air inlet and the fluid inlet extend in directions perpendicular to each other.

8. The pressure sensor device of claim 3, wherein the pressure transmission medium has a waterproofing capability to prevent direct contact between the fluid and the pressure sensor chip.

9. The pressure sensor device of claim 3, wherein the pressure transmission medium comprises gel having a shape variable depending on the pressure of the fluid.

10. The pressure sensor device of claim 3, the pressure transmission medium comprises silicone or epoxy having a shape variable depending on the pressure of the fluid.

11. The pressure sensor device of claim 3, wherein the substrate and the pressure sensor chip are electrically connected to each other using conductive leads, and
wherein the pressure sensor chip and the conductive leads are encapsulated using the pressure transmission medium.

12. The pressure sensor device of claim 1, further comprising an integrated circuit (IC) chip mounted on the substrate to convert an analog signal output generated by the pressure sensor chip, into a digital signal output.

13. The pressure sensor device of claim 1, wherein the pressure sensor device has a connected structure in which the air flowing in through the air inlet moves through the second inner region to the lower region and reaches the pressure sensor chip exposed by the through-hole.

14. A pressure sensor device comprising:
- a substrate comprising a first through-hole and a second through-hole;
- a pressure sensor chip mounted on the substrate to cover the first through-hole in such a manner that a bottom surface thereof is exposed to the air through the first through-hole, in order to measure a pressure of a fluid relative to a pressure of the air;
- a barrier bonded to a top surface of the substrate to protect the pressure sensor chip and to define an inner space;
- an upper housing bonded onto the barrier to protect at least a part of the pressure sensor chip, and comprising an air inlet and a fluid inlet provided in different directions; and
- a lower housing bonded to a bottom surface of the substrate to protect the pressure sensor chip and to provide a passage in which the air flowing in through the air inlet sequentially passes through the second through-hole and the first through-hole.

15. The pressure sensor device of claim 14, wherein the inner space is divided with respect to the barrier into a first inner region in which the pressure sensor chip is provided and a second inner region through which the air passes.

16. A pressure sensor device comprising:
- a substrate comprising a first through-hole and a second through-hole;
- a housing surrounding at least a part of the substrate to provide the first and second through-holes therein, and comprising a first surface in which a fluid inlet is provided and a second surface in which an air inlet is provided and which is different from the first surface; and
- a pressure sensor chip mounted on the substrate in order to measure a pressure of a fluid, which is applied to the fluid inlet, relative to a pressure of the air, which is applied to the air inlet,
- wherein the housing comprises a first inner region connected to the fluid inlet to receive the pressure of the fluid, and a second inner region connected to the air inlet to receive the pressure of the air and divided from the first inner region by an inner wall on the substrate between the first and second through-holes, and
- wherein the pressure sensor chip is mounted on the first through-hole such that a surface thereof is provided in the first inner region and another surface thereof receives the pressure of the air of the second inner region through the first through-hole.

17. The pressure sensor device of claim 16, wherein the first surface is a top surface of the housing,
- wherein the second surface is a side surface of the housing, and
- wherein the fluid inlet and the air inlet are provided above a front surface of the substrate.

18. The pressure sensor device of claim 16, wherein the first and second surfaces are provided in directions perpendicular to each other.

19. The pressure sensor device of claim 14, further comprising a pressure transmission medium encapsulating the pressure sensor chip and of transmitting the pressure of the fluid to allow the pressure sensor chip to measure the pressure.

20. A method of manufacturing a pressure sensor device, the method comprising:
- preparing a substrate comprising two or more through-holes through which the air passes;
- mounting a pressure sensor chip on the substrate to cover the through-hole in such a manner that a bottom surface of the pressure sensor chip is exposed to the air through the through-hole, in order to measure a pressure of a fluid relative to a pressure of the air;
- providing an integrated circuit (IC) chip on the substrate;
- providing a barrier having a contact with the substrate and defining an inner space, to protect the pressure sensor chip and the IC chip;
- providing a pressure transmission medium encapsulating at least parts of the pressure sensor chip and the IC chip, in the inner space;
- providing a lower housing on a bottom surface of the substrate to protect the pressure sensor chip exposed by the through-hole; and
- providing an upper housing comprising an air inlet and a fluid inlet provided in different directions, on the barrier.

* * * * *